United States Patent [19]

McDermott et al.

[11] Patent Number: 4,931,748

[45] Date of Patent: Jun. 5, 1990

[54] INTEGRATED CIRCUIT WITH CLOCK GENERATOR

[75] Inventors: Mark W. McDermott; Antone L. Fourcroy, both of Austin, Tex.

[73] Assignee: Motorola, Inc., Schamburg, Ill.

[21] Appl. No.: 364,510

[22] Filed: Jun. 9, 1989

Related U.S. Application Data

[63] Continuation-in-part of Ser. No. 237,022, Aug. 26, 1988, abandoned.

[51] Int. Cl.⁵ .............................................. H03L 7/08
[52] U.S. Cl. ..................................... 331/1 A; 331/17; 331/18; 331/25
[58] Field of Search ....................... 331/1 A, 4, 17, 18, 331/25, 108 C, DIG. 2

[56] References Cited

U.S. PATENT DOCUMENTS

3,676,801  7/1972  Musa ............................... 368/156 X

Primary Examiner—David Mis
Attorney, Agent, or Firm—Jonathan P. Meyer

[57] ABSTRACT

A microprocessor or other integrated circuit including a clock generator circuit which is dependent on an externally-provided reference signal includes the capability of detecting the loss of this externally-provided reference signal and producing an alternate clock signal despite the loss of the reference. In a particular embodiment, the clock generator comprises a phase locked loop frequency synthesizer which normally relies on an external crystal oscillator for its reference frequency signal. The generator includes a circuit for detecting abnormalities in the crystal signal and switching the voltage controlled oscillator of the frequency synthesizer to an internally-generated reference voltage. In the particular embodiment, the clock generator is also capable of producing a reset signal in response to the loss of the reference signal.

28 Claims, 5 Drawing Sheets

| BIT 15 | | | | | | | | | | | | | | | BIT 0 |
|---|---|---|---|---|---|---|---|---|---|---|---|---|---|---|---|
| W | X | Y5 | Y4 | Y3 | Y2 | Y1 | Y0 | EDIV | 0 | 0 | SLIMP | SLOCK | RSTEN | STSIM | STEXT |

*FIG.3*

| | |
|---|---|
| *FIG.4B* | *FIG.4C* |

INTEGRATED CIRCUIT WITH CLOCK GENERATOR

CONTINUATION IN PART OF PRIOR APPLICATION

The present invention is a continuation in part of application Ser. No. 237,022, filed Aug. 26, 1988, now abandoned, and assigned to the assignee of the present invention.

FIELD OF THE INVENTION

The present invention relates, in general, to a microprocessor or other integrated circuit device with an on-board clock signal generating circuit. More particularly, the invention relates to a clock signal generating circuit which normally relies on an external crystal oscillator to provide the reference frequency from which the clock signal is generated, but which is capable of detecting the loss of the reference frequency and reverting to a "limp mode" in which a stable clock signal is produced without an external reference frequency.

In addition, the present invention relates, in general, to a circuit which is useful for detecting the loss of a clock signal and which is also useful for rapidly slewing a voltage controlled oscillator to a programmable reference frequency during power-up. More particularly, the invention relates to a circuit which detects an occurrence of events in which the clock signal remains in a particular state for greater than a predetermined length of time and which generates, in response to such events, a loss of clock signal.

BACKGROUND OF THE INVENTION

Microprocessors and other integrated circuits typically require stable clock signals for their internal operations. In very early integrated circuit microprocessors, these signals were provided by circuits external to the microprocessor, typically in the form of a second integrated circuit dedicated to that purpose. In more recent designs, the clock signal generating circuits are integrated onto the same chip as the microprocessor or other device. In either case, the clock signal generating circuits typically rely upon an externally-provided crystal oscillator to provide the reference frequency upon which the clock signal is based.

The generation of a stable, known duty-cycle clock signal from the signal provided by the external crystal oscillator is accomplished by any of several known means. Most commonly, an inverter circuit of the general type disclosed in U.S. Pat. No. 3,676,801 is used in conjunction with the crystal to produce an acceptable clock signal. This clock signal may be divided down to the desired frequency of the clock signal for the microprocessor or other circuit. In some cases, a phase locked loop (PLL) frequency synthesizer circuit is used in addition to the basic input circuit. The PLL circuit typically comprises a phase comparator, a filter, a voltage controlled oscillator (VCO) and a divider chain. An example of a microprocessor with such a clock signal generating circuit is the MC146805H2, which is available from Motorola, Inc. of Austin, Tex.

A problem which occurs in integrated circuits which rely upon an external crystal oscillator as a clock signal reference, and particularly in microprocessors, is that of loss of the crystal signal. Through mechanical failure or other causes, the frequency reference signal produced by the crystal oscillator may be lost. This causes the microprocessor to stop operating suddenly. For instance, if the microprocessor is performing engine control functions in a vehicle, the engine may stop suddenly and, perhaps, place the occupants of the vehicle in some danger. Problems such as loss of the crystal reference signal become more important as microprocessors are increasingly used in harsh environments, such as that of an under-hood engine management system.

The present invention operates using a wider range of reference frequencies than those normally used by prior analog techniques. Prior analog techniques for detecting a loss of clock signal have the disadvantage that they do not generally function adequately using low frequency oscillators because the analog circuit components required (i.e. a very large capacitor and a very small current source) are difficult to incorporate on a microcomputer integrated circuit. The present invention, however, provides a digital circuit which is useful for detecting the loss of a clock signal across the entire range of possible reference frequencies without a significant degradation of performance at lower frequencies.

SUMMARY OF THE INVENTION

Accordingly, it is an object of the present invention to provide a digital circuit which is useful for detecting the loss of a clock signal across a wide range of frequencies.

This and other objects and advantages of the present invention are provided by an apparatus for receiving an oscillator signal and for detecting a loss of the oscillator signal comprising: a first input coupled to a source of the oscillator signal; a second input coupled to a source of a clock signal; a first shift register comprising an input coupled to the first input and a first plurality of stages, each of said first plurality of stages having a clock input coupled to the second input and an output; first logic means having an input coupled to the first input for inverting the oscillator signal; a second shift register comprising an input coupled to the first logic means and a second plurality of stages, each of said second plurality of stages having a clock input coupled to the second input and an output; second logic means having inputs coupled to said outputs of each of said stages of said first shift register for producing a first loss signal when all of said outputs are in a predetermined logic state; third logic means having inputs coupled to said outputs of each of said stages of said second shift register for producing a second loss signal when all of said outputs are in a predetermined logic state; and fourth logic means having inputs coupled to receive said first and second loss signals for producing a loss of oscillator signal when either of said first and second loss signals is received.

These and other objects and advantages will be apparent to one skilled in the art from the detailed description below taken together with the drawings.

DETAILED DESCRIPTION OF THE INVENTION

The terms "assert" and "negate", and various grammatical forms thereof, are used herein to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

Figure 1:
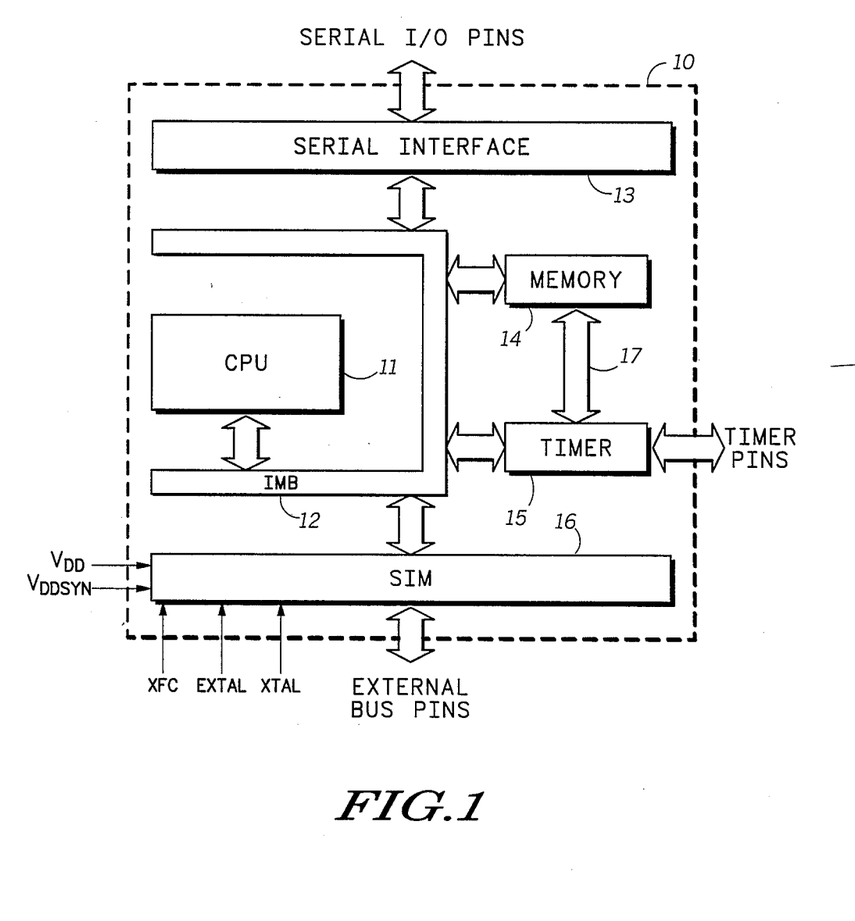
FIG. 1 is a block diagram of an integrated circuit microcomputer of a particular embodiment of the present invention.

FIG. 1 illustrates a microcomputer of which a preferred embodiment of the present invention is a part. Microcomputer 10, which is intended for manufacture as a single integrated circuit, comprises a central processing unit (CPU) 11, an inter-module bus (IMB) 12, a serial interface 13, a memory module 14, a timer 15 and a system integration module (SIM) 16. Each of CPU 11, serial interface 13, memory 14, timer 15 and SIM 16 is bi-directionally coupled to IMB 12 for the purpose of exchanging address, data and control information. In addition, timer 15 is bi-directionally coupled to memory 14 by means of an emulation bus 17.

Serial interface 13 and timer 15 are each coupled to a number of pins, or connectors, for communication with devices external to microcomputer 10. In addition, SIM 16 is coupled to a number of pins comprising an external bus and to power supply (VDD and VDDSYN) and crystal oscillator pins EXTAL (external crystal oscillator I/clock input), XTAL (external crystal oscillator II) and XFC (external filter capacitor).

SIM 16 includes many of the features necessary for implementing a modular microcomputer architecture. In addition to many other functions, SIM 16 is responsible for generating the clock signals relied upon by all of the other components of microcomputer 10 and those external devices coupled to the external bus. A crystal may be connected across the EXTAL and XTAL pins and used to generate a reference frequency signal which is used by circuits internal to SIM 16 to generate the necessary clock signals. In addition, an externally generated clock signal may be directly provided to the EXTAL pin, obviating the need for the internal clock generating circuits. This is a common feature of integrated circuits with clock generating circuits. The VDDSYN input is used to provide a separate power supply for the clock generating circuit in order to reduce noise and interference problems, and also to separately power the crystal oscillator for power down operation. The XFC pin is used to connect an external filter capacitor into the clock generating circuit, as is disclosed more fully below.

Figure 2:
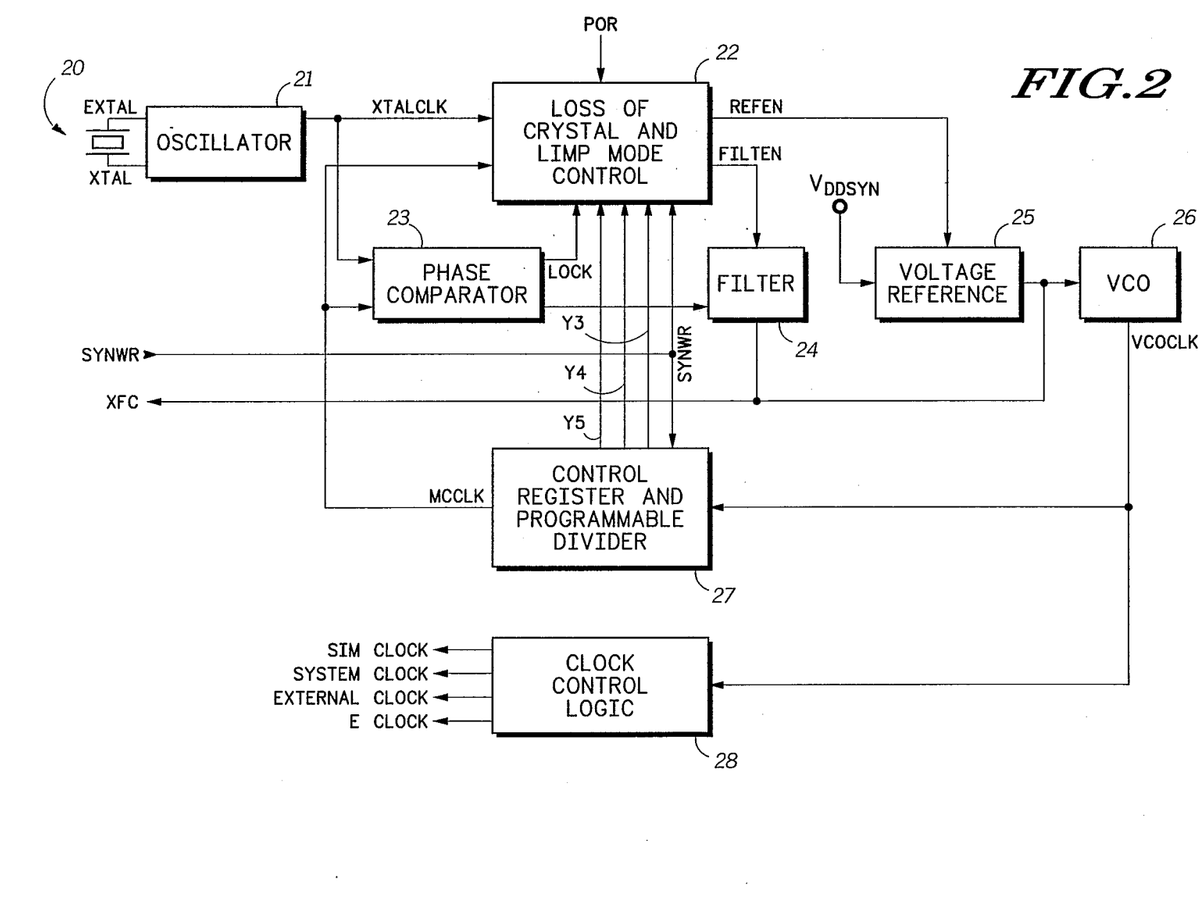
FIG. 2 is a block diagram of the clock signal generator apparatus of the microcomputer of FIG. 1.

FIG. 2 is a block diagram of the clock generating apparatus of the microcomputer of FIG. 1. This circuit, as mentioned, is located within SIM 16. The basic components of this apparatus include an oscillator circuit 21, loss of crystal and limp mode control logic 22, a phase comparator 23, a loop filter 24, voltage reference circuit 25, a voltage-controlled oscillator 26, a programmable divider 27 and clock control logic 28.

A crystal 20 is connected across the EXTAL and XTAL pins, which are connected to an oscillator circuit 21. The output of oscillator circuit 21 is a signal XTALCLK (crystal clock). The XTALCLK signal is connected as an input to loss of crystal and limp mode control logic circuit 22 and to phase comparator circuit 23. Logic 22 also receives inputs signal POR (power-on reset), LOCK (synthesizer lock), MCCLK (modulo counter clock), control register bis Y3–Y5 (see FIG. 3) and SYNWR (synthesizer write) and produces output signals FILTEN (filter enable) and REFEN (reference voltage enable). Phase comparator 23 receives the XTALCLK and MCCLK signals as inputs and produces the LOCK signal and a phase error signal as outputs. Loop filter circuit 24 receives the phase error output of phase comparator 23 as an input and produces a control voltage signal as an output. Voltage reference circuit 25 receives VDDSYN as an input and produces a control voltage signal as an output. Both circuit 24 and circuit 25 are connected to the XFC pin to allow an external filter capacitor to be used as part of the circuit. Additionally, the FILTEN signal from logic 22 is an enabling control input to filter circuit 24, and the REFEN signal from logic 22 is an enabling control input to circuit 25. Circuit 24 and circuit 25 are never enabled at the same time. The control voltage signal output of circuit 24 and the control voltage signal output of circuit 25 are both connected, using a wire-OR configuration, to the input of VCO 26. The output of VCO 26 is a clock signal VCOCLK. This clock signal is provided as an input to programmable divider 27, which produces the MCCLK signal, and to clock control logic 28, which produces the various clock signals used by microcomputer 10.

But for the operation of loss of crystal and limp mode control logic 22 and voltage reference circuit 25, the apparatus of FIG. 2 operates in the familiar manner as a PLL frequency synthesizer and clock generator. The loop circuit comprising phase comparator 23, loop filter 24, VCO 26, and control register and programmable divider 27 receives the oscillator signal XTALCLK as a frequency reference signal and produces a synthesized signal VCOCLK, the frequency of which is related to that of XTALCLK by the operation of control register and programmable divider 27. The clock generator portion of the apparatus, comprising clock control logic 28, simply takes the VCOCLK signal and produces several different clock signals therefrom. The SIM clock signal is used to supply SIM 16 with its clocking signals. The system clock signal is used by most of the remainder of microcomputer 10 and is one of the signals carried by IMB 12. The external clock is one of the signals carried by the external bus and is used by devices external to microcomputer 10. The E clock is used by a portion of SIM 16 which generates chip selects signals for use by devices external to microcomputer 10 and is provided mainly to maintain compatibility with previously-designed peripheral components. The design, manufacture and operation of PLL frequency synthesizers and clock generator circuits is well known in the semiconductor industry and will not be further described herein.

Whenever logic 22 detects the powering-up of the microcomputer 10, or the loss of the crystal reference signal, or the occurrence of other events described below, the FILTEN signal is negated causing the output of loop filter 24 to disconnect from the input of VCO 26, and the REFEN signal is asserted causing the output of the voltage reference circuit 25 to connect to the input of VCO 26. Thus, the operation of VCO 26 is no longer dependent on the control voltage signal produced by loop filter 24 to determine its operating frequency. Instead, the operating frequency of VCO 26 is determined solely by the chosen output voltage of the voltage reference circuit 25. The reference voltage will usually, but not necessarily, be chosen to provide a much lower frequency VCOCLK than is provided in normal operation. The purpose is not to maintain system operation as if the crystal signal had not been lost, but to provide a fall-back mode of operation in which microcomputer 10 can either perform an orderly shutdown or continue to operate at a much-reduced level of capacity.

The design details of logic 25 will be immediately apparent to one of skill in the art. Many suitable voltage reference circuits are widely known. A voltage reference suitable for this application should have a relatively stable output over the specified temperature range of microcomputer 10 and should also be relatively stable over variations in the process used to manufacture the integrated circuit.

Figure 3:
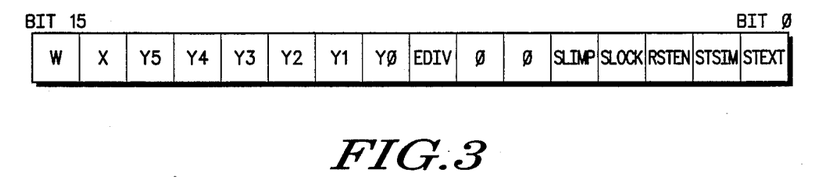
FIG. 3 is a diagram illustrating the bits of a control register of the apparatus of FIGS. 1 and 2.

FIG. 3 illustrates a 16-bit frequency synthesizer control register used by the apparatus of FIG. 2. This register is readable and writable by CPU 11. The upper byte (bits 8-15) of this register control the frequency of operation of the clock signal generating apparatus. Bits 8-13 (Y0-Y5) and bit 15 (W) control programmable divider 27. Bits 11-13 (Y3-Y5) also control how quickly the circuit in FIG. 4B can detect that a loss of crystal has occurred. Bit 14 (X) controls a prescaler in clock control logic 28. In the particular embodiment, the frequency of VCOCLK is given by $F = FEXTAL*4(Y+1)(2^{2W+1})$. Adding the effect of the X bit prescaler in logic 28, the system clock frequency is given by $F = FEXTAL*4(Y+1)(2^{2W+X})$. As is apparent, any change in programmable divider 27 will result in a temporary loss of "lock" by the synthesizer. The provision of the X bit prescaler in logic 28 allows the frequency of the clock signals produced by logic 28 to be changed quickly (although only by a factor of two) without upsetting the phase lock loop circuit.

Bit 7 (EDIV) is used to determine the divide ratio between the E clock and external clock signals generated by logic 28. If EDIV is 1, the external clock is divided by 16 to produce the E clock. If EDIV is 0, the external clock is divided by 8.

Bits 5 and 6 of this register are not used and read as zero.

Bit 4 (SLIMP) is a status flag that is asserted when the microcomputer 10 is in limp mode and is negated when the REFEN signal is negated.

Bit 3 (SLOCK) of this register is a read-only status flag which, when equal to 1, indicates that either the internal clock generation apparatus is disabled, or that the PLL is locked onto the desired frequency of operation. I equal to 0, the clock generation apparatus is enabled and not yet locked onto a stable frequency.

Bit 2 (RSTEN) determines which of two options are executed in response to a loss of crystal detection. If equal to 1, SIM 16 will cause a system reset upon loss of crystal. If equal to 0, loss of crystal will cause the limp mode to be entered, in which the clock signal continues to be generated, but at a much-reduced frequency.

Bit 1 (STEXT) determines the effect on the external clock signal when CPU 11 executes a low power stop instruction. If 1, logic 28 will continue to drive the external clock signal from the SIM clock signal during the power-down period following the instruction. If 0, the external clock line is driven low during power-down.

Bit 0 (STSIM) determines the effect on the SIM clock when CPU 11 executes the low power stop instruction. If 1, the clock generating apparatus continues to operate normally to generate the SIM clock from VCOCLK during the low power period. If 0, the SIM clock is driven directly by EXTALCLK during the low power period and the frequency synthesizer is shut down to reduce power consumption. Since the SIM contains the interrupt and reset circuits which are capable of ending the power-down period, some clock signal must be provided to the SIM during the power-down period.

Figure 4A:
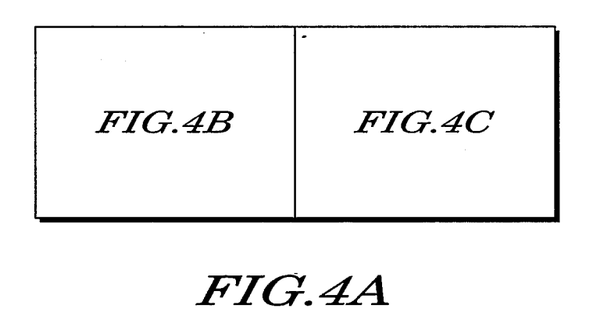
FIGS. 4A–4C are a logic diagram of a loss of crystal detect and limp mode control logic portion of the apparatus of FIGS. 1 and 2.
Figure 4B:
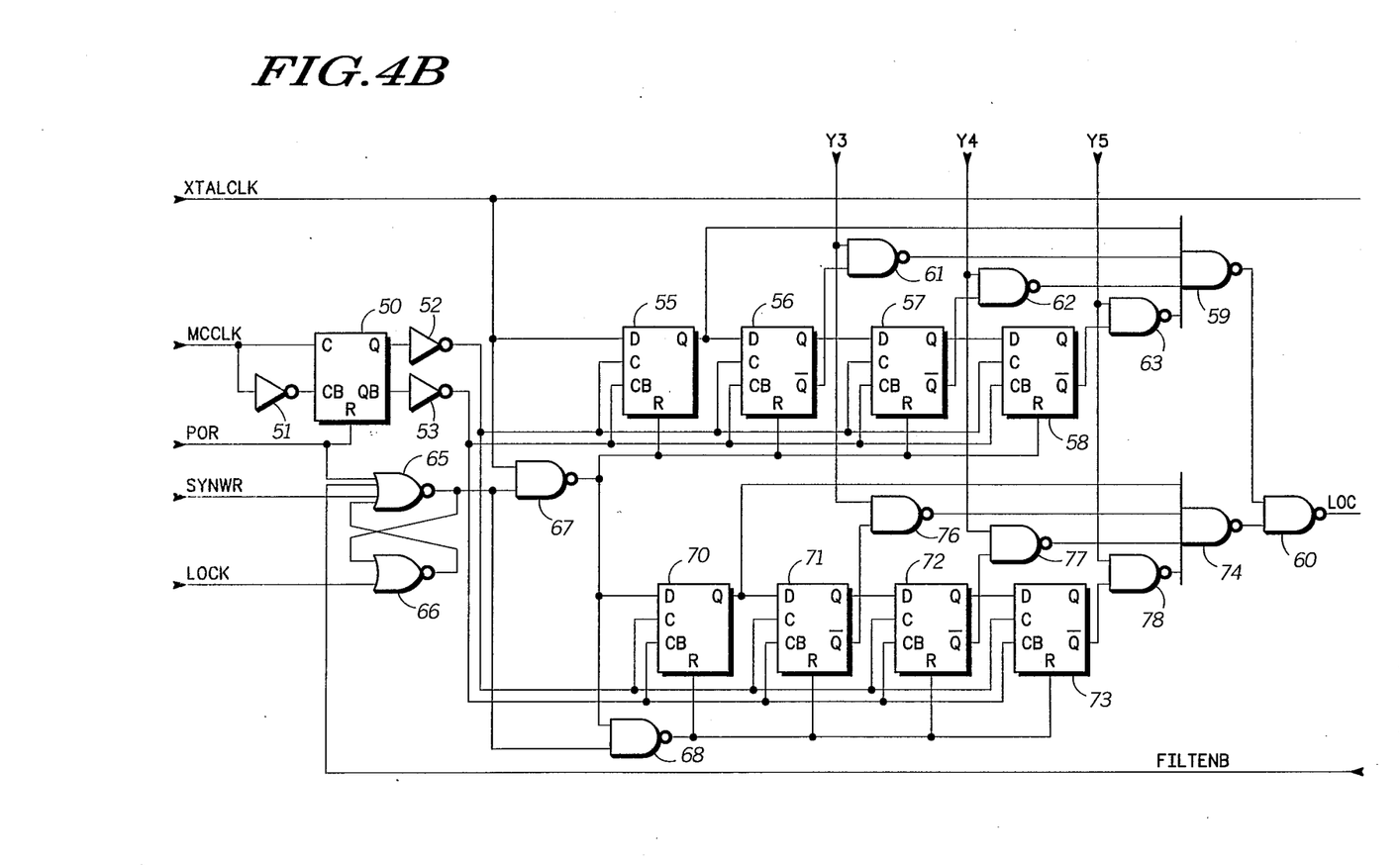
Figure 4C:
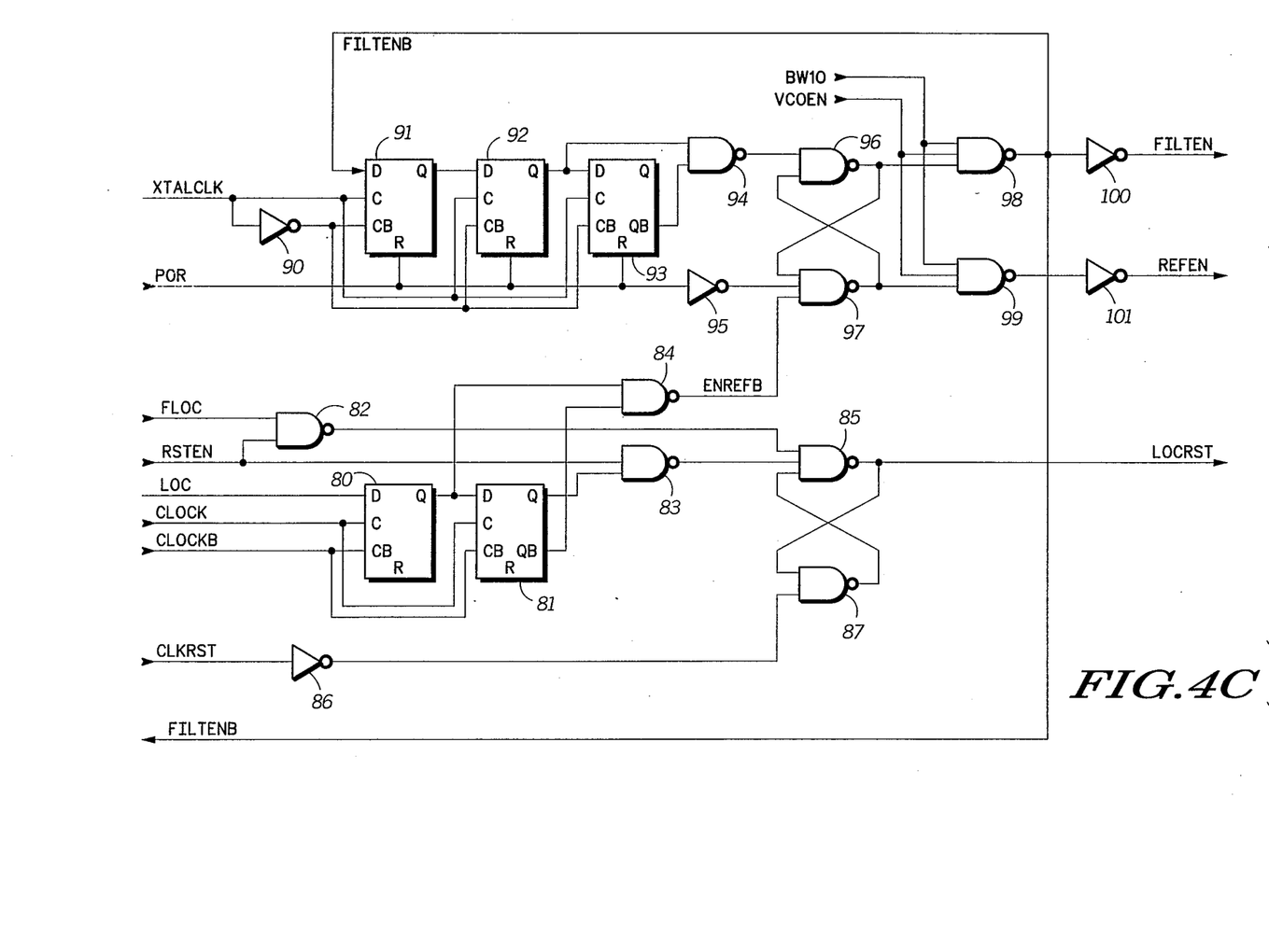

FIGS. 4B and 4C comprise a logic diagram of loss of crystal and limp mode control logic 22 of FIG. 2. FIG. 4A illustrates how FIGS. 4B and 4C inter-relate. The apparatus of FIG. 4B performs the loss of crystal detection function and the apparatus of FIG. 4C performs the function of generating control signals therefrom.

The apparatus of FIG. 4B operates, in summary, by using the MCCLK signal to clock two four-stage shift registers. One of the shift registers is used to detect when the XTALCLK signal remains in a high state for too long and the other shift register is used to detect when the XTALCLK signal remains in a low state for too long. When either case is true and LOC (loss of crystal) signal is asserted.

The response time of the circuit in FIG. 4B may not be as fast as desirable when the microcomputer 10 is operating at a very low frequency. Because the clock (MCCLK) operating the phase lock loop circuit is running very slowly, the loss of clock circuit may not respond as quickly as desired to detect that there has been a loss of reference clock. Under extreme circumstances it is even possible for the circuit in FIG. 4B to track the reference clock as it stops. Therefore, it is desirable at lower operating frequencies to speed up the response time of the circuit in FIG. 4B so that the phase lock loop circuit can more quickly detect that there has been a loss of reference clock. The control bits Y3-Y5 from the frequency synthesizer control register in FIG. 3 are used to selectively bypass one, two, or three stages of both four-stage shift registers. Shift register stages are bypassed so that the apparatus of FIG. 4B can decrease the length of time that XTALCLK has to remain either continuously high or continuously low before the LOC signal is asserted. The more stages that are bypassed, the more quickly the circuit will detect that a loss of reference clock has occurred. Each control bit (Y3-Y5) causes one stage of both shift registers to be bypassed.

The eight signals which comprise the inputs of the apparatus of FIG. 4B are XTALCLK, MCCLK, POR, SYNWR, LOCK and Y3-Y5. The SYNWR signal indicates that the settings of programmable divider 27 have been changed by a write to the synthesizer control register. The other signals have been described above. The MCCLK signal is connected to the clock (C) input of a flip-flop 50 and, through an inverter 51, to the clock-bar (CB) input of flip-flop 50. The POR signal is connected to the reset (R) input of flip-flop 50. The Q output of flip-flop 50 is connected to the input of an inverter 52 and the QB output of flip-flop 50 is connected to the input of an inverter 53. The outputs of inverters 52 and 53 provide the clock signals which drive the two shift registers described above.

The "stuck high" shifter register comprises latches 55, 56, 57 and 58.

The C input of each is connected to the output of inverter 52 and the CB input of each is connected to the output of inverter 53. The D input of latch 55 is connected to the XTALCLK signal and the D inputs of each of the succeeding latches is connected to the Q output of the preceding latch. The Q output of latch 55 is connected as an input to a NAND gate 59. The three Q-bar outputs of latches 56–58 are each connected as an input to one of the three NAND gates 61–63, respectively. The other input to NAND gates 61–63 are control bits Y3–Y5, respectively. The outputs of NAND gates 61–63 are all inputs to NAND gate 59, whose output is connected as an input to a NAND gate 60. The output of NAND gate 60 is the LOC signal.

The SYNWR signal is connected as an input of an NOR gate 65. The POR signal is connected as another input of NOR gate 65, as is the inverse of the FILTEN signal, FILTENB. The fourth input of NOR gate 65 is the output of an NOR gate 66. The LOCK signal is connected as one input of NOR gate 66 and the output of NOR gate 65 is the other input of NOR gate 66. The output of NOR gate 65 is connected as one input of a NAND gate 67 and as one input of a NAND gate 68. The XTALCLK signal is connected as the other input of NAND gate 67, and the output of NAND gate 67 is connected as the other input to NAND gate 68.

The output of NAND gate 67 is also connected to the reset inputs of each of latches 55–58. Under normal operating conditions, each time XTALCLK goes low, the output of NAND gate 67 goes high, which resets latches 55–58. If, however, XTALCLK stays high for a sufficiently long period, this high value will be clocked through all of latches 55–58 and all of the inputs to NAND gate 59 will become active, resulting in the assertion of LOC.

Input signals Y3–Y5 affect the amount of time that XTALCLK must be "stuck high" before a loss of crystal signal (LOC) is generated. If input Y5 is zero, the output of NAND gate 63 will be high and the corresponding input to NAND gate 59 will be active. Therefore when Y5 is 0, the last stage of the shift register is effectively bypassed because the value contained in flip-flop 58 does not affect the generation of the LOC signal. Similarly, if both inputs Y4 and Y5 are zero, the outputs of both NAND gate 62 and NAND gate 63 will be high and the corresponding two inputs to NAND gate 59 will be active. Therefore when both Y4 and Y5 are 0, the last two stages of the shift register are effectively bypassed because the values contained in flip-flop 57 and flip-flop 58 do not affect the generation of the LOC signal. Input Y3 functions in the same manner as inputs Y4 and Y5. Bypassing stages of the shift register allows the LOC signal to go active after the XTALCLK has been 37 stuck high" a shorter period of time as measured in MCCLK cycles.

The "stuck low" shift register comprises latches 70, 71, 72 and 73. The C and CB inputs of each are connected to the outputs of inverters 52 and 53, respectively. The D input of latch 70 is connected to the output of NAND gate 67 and the D inputs of each of the succeeding latches is connected to the Q output of the preceding stage. The Q output of latch 70 is connected as an input to a NAND gate 74. The three Q-bar outputs of latches 71–73 are each connected as an input to one of the three NAND gates 76–78, respectively. The other input to NAND gates 76–78 are control bits Y3–Y5, respectively. The outputs of NAND gates 76–78 are all inputs to NAND gate 74. The output of NAND gate 74 is connected as an input of NAND gate 60.

The reset inputs of each of latches 70–73 are connected to the output of NAND gate 68. Under normal operating conditions, each time XTALCLK goes high, the output of NAND gate 68 goes high, which resets latches 70–73. If, however, XTALCLK stays low for a sufficiently long period, the high value at the output of NAND gate 67 will be clocked through all of latches 70–73 and all of the inputs to NAND gate 74 will become active, resulting in the assertion of LOC.

Input signals Y3–Y5 affect the amount of time that XTALCLK must be "stuck low" before a loss of crystal signal (LOC) is generated. If input Y5 is zero, the output of NAND gate 78 will be high and the corresponding input to NAND gate 74 will be active. Therefore when Y5 is 0, the last stage of the shift register is effectively bypassed because the value contained in flip-flop 73 does not effect the generation of the LOC signal. Similarly, if both inputs Y4 and Y5 are zero, the outputs of both NAND gate 77 and NAND gate 78 will be high and the corresponding two inputs to NAND gate 74 will be active. Therefore when both Y4 and Y5 are 0, the last two stages of the shift register are effectively bypassed because the values contained in flip-flop 72 and flip-flop 73 do not effect the generation of the LOC signal. Input Y3 functions in the same manner as inputs Y4 and Y5. Bypassing stages of the shift register allows the LOC signal to go active after the XTALCLK has been "stuck low" a shorter period of time as measured in MCCLK cycles.

As described, the apparatus of FIG. 4B will assert the LOC signal whenever the XTALCLK signal has been stuck in a particular state for more than a programmable length of time. This same function could be accomplished in a number of ways using various digital means, such as a counter or random logic, which count the length of time that the signal from the crystal is stuck on either high or low.

Under certain conditions, the most important of which is a change in the divide ratio of programmable divider 27 (FIG. 2), it is desirable to prevent the assertion of LOC. Consider a change in the divide ratio which is intended to result in a slower system clock (i.e.: a decrease in the value of the Y or W bits of the synthesizer control register). The immediate effect of such a change is that MCCLK will be at a much higher frequency than XTALCLK, at least until the phase-locked loop re-establishes stable operation. If some precaution were not taken against this situation, this might result in the inadvertent assertion of LOC, since MCCLK controls the rate at which the "stuck high" and "stuck low" shift registers are clocked. The inadvertent assertion of LOC is undesirable for two reasons. First, the VCO 26 (FIG. 2) would slew toward the operating frequency determined by the voltage reference circuit rather than that determined by the new synthesizer control register setting. And second, a system reset could occur.

The function of preventing the assertion of LOC under these circumstances is served by NOR gates 65 and 66. Under normal operating conditions, LOCK is active and POR, SYNWR and FILTENB are inactive. Thus, the output of NOR gate 65 is active. This enables the outputs of NAND gates 67 and 68 to change with the changes of XTALCLK. However, when SYNWR is asserted, reflecting a change in the synthesizer control register, the output of NOR gate 65 becomes inactive, forcing the outputs of NAND gates 67 and 68 to remain active regardless of XTALCLK. This keeps both the "stuck high" and the "stuck low" shift registers in reset and prevents the assertion of LOC. Because of the cross-coupling of NOR gates 65 and 66, the output of NOR gate 65 remains inactive until LOCK has become inactive and been re-asserted by the establishment of stable operation at the new operating frequency.

The apparatus of FIG. 4C performs the functions required to generate the FILTEN and REFEN control signals, in addition to generating a loss of crystal reset signal (LOCRST) in appropriate circumstances. The input signals to the illllustrated apparatus include XTALCLK, POR and the LOC signal produced by the apparatus of FIG. 4B. In addition, signals referred to as FLOC (force loss of crystal), RSTEN (loss of crystal reset enable) and CLKRST (clock reset) provide inputs. A clock signal (CLOCK and CLOCKB) which is related to the SIM Clock signal produced by logic 28 of FIG. 1 is also used. The FLOC signal is a test signal which forces a loss of crystal reset condition. The RSTEN signal is related to bit 2 of the synthesizer control register. The CLKRST signal is a clock reset signal.

The LOC signal is connected to the D input of a latch 80, the C and CB inputs of which are connected to the CLOCK and CLOCKB signals, respectively. The Q output of latch 80 is connected to the D input of a latch 81, which is also clocked by the CLOCK and CLOCKB signals. The RSTEN and FLOC signals are connected as inputs to a NAND gate 82. The RSTEN signal is also connected as an input to a NAND gate 83. The Q output of latch 81 is also connected as an input to NAND gate 83. The QB output of latch 81 is connected as an input to a NAND gate 84. The Q output of latch 80 is also connected as an input of NAND gate 84. The output of NAND gate 84 is a signal referred to as ENREFB. The output of NAND gate 82 is connected as an input of a NAND gate 85. The output of NAND gate 83 is also connected as an input of NAND gate 85. The CLKRST signal is connected as the input of an inverter 86. The output of inverter 86 is connected as an input of a NAND gate 87. The output of NAND gate 85 is also connected as an input of NAND gate 87. The output of NAND gate 87 is connected as an input of NAND gate 85. The output of NAND gate 85 is the LOCRST signal which causes microcomputer 10 to be reset upon loss of crystal, if the appropriate logical conditions are met.

The XTALCLK signal is connected to the input of an inverter 90. The C and CB inputs of a shift register comprising latches 91, 92 and 93 are connected to the XTALCLK signal and the output of inverter 90, respectively. The D input of latch 91 is connected to the output of NAND gate 98 which generates the FILTENB signal. The Q output of latch 91 is connected to the D input of latch 92 and the Q output of latch 92 is connected to the D input of latch 93. The Q output of latch 92 and the QB output of latch 93 are connected as inputs of a NAND gate 94. The POR signal is connected to the reset inputs of latches 91, 92 and 93. The POR signal is also connected to the input of an inverter 95. The output of NAND gate 94 is connected as an input of a NAND gate 96. The output of NAND gate 96 is connected as an input of a NAND gate 97. The output of inverter 95 and the ENREFB signal are connected as inputs of NAND gate 97. The output of NAND gate 97 is connected as an input of NAND gate 96. The output of NAND gate 96 is connected as an input of NAND gate 98. A test signal referred to as BW10 and a signal referred to as VCOEN (VCO enable) are also connected as inputs of NAND gate 98. The BW10 and VCOEN signals are also connected as input of a NAND gate 99. The output of NAND gate 97 is also connected as an input of NAND gate 99. The output of NAND gate 98 is the FILTENB signal and is connected to the input of an inverter 100. The output of inverter 100 is the FILTEN signal. The output of NAND gate 99 is connected as the input of an inverter 101. The output of inverter 101 is the REFEN signal.

While the apparatus of FIGS. 4B and 4C perform the necessary loss of crystal detection and control signal generation functions in the particular embodiment of the invention being described here, many possible alternative logic designs exist which would perform the same functions. The apparatus described requires that the EXTALCLK signal remain in the same state for a predetermined length of time before the LOC signal is generated, thus ensuring that momentary losses of the crystal reference signal do not cause microcomputer 10 to enter limp mode. Further, the disclosed apparatus uses the reference voltage to drive the VCO, rather than the crystal reference, during power-on reset. This is intended to provide faster stabilization of the VCOCLK signal after a power-on reset, since the VCO frequency will slew more rapidly toward its eventual stable operating point if driven by the more stable reference voltage. The response time of the apparatus of FIGS. 4B and 4C can be programmably adjusted so that the length of time required to detect a loss of crystal can be reduced at low VCO frequencies to prevent the phase lock loop from tracking to zero Hz.

The disclosed apparatus provides an improved clock generating circuit for a microprocessor or other integrated circuit. Upon loss of the reference signal from the crystal, the disclosed apparatus produces a stable, although usually slower, clock signal. Alternatively, the apparatus is programmable to produce a reset upon detection of loss of crystal. Either mode of operation provides a predictable response to loss of the crystal signal, as opposed to the unpredictable results produced by prior art clock signal generating circuits. It is possible that, in some circumstances, the alternate clock signal produced while in the limp mode will actually be faster than the normal clock signal. This is due to the fact that the limp mode clock rate is established by the reference voltage circuit and, in the particular embodiment described, is approximately 8 MHz, while the normal clock signal is programmable by means of the various bits of the control register illustrated in FIG. 3. The normal clock rate, assuming a crystal frequency of approximately 32 kHz, ranges from approximately 0.1 MHz to approximately 65 MHz.

While the present invention has been shown and described with reference to a particular embodiment thereof, various modifications and changes thereto will be apparent to those skilled in the art and are within the spirit and scope of the present invention.

We claim:

1. An integrated circuit comprising clock signal generator means for receiving a reference signal and for generating a clock signal of a first frequency, the generator means further comprising:
   first means for detecting the loss of the reference signal and for producing a loss of signal output; and
   second means coupled to receive the loss of signal output from the first means for generating a clock signal of a second frequency different from the first frequency in response to receipt of the loss of signal output.

2. An integrated circuit according to claim 1 wherein said second means further comprises:
a voltage-controlled oscillator;
a voltage reference circuit; and
switch means controlled by the loss of signal output of said first means for selectably coupling an output of the voltage reference circuit to an input of the voltage-controlled oscillator.

3. An integrated circuit according to claim 2 further comprising:
power-on reset means for producing a power-on reset control signal, the switch means being responsive to the power-on reset control signal to couple the output of the reference voltage circuit to the voltage-controlled oscillator.

4. An integrated circuit according to claim 1 further comprising:
reset means coupled to receive the loss of signal output from the first means for selectably generating a loss of signal reset signal in response to receipt of the loss of signal output; and
control means for controlling whether the reset means generates the loss of signal reset signal in response to receipt of the loss of signal output.

5. An integrated circuit comprising:
clock signal generator means for receiving a reference frequency signal and for generating a clock signal of a first predetermined frequency in response to the reference frequency signal;
wherein the improvement comprises:
loss of reference signal detect means for receiving the reference frequency signal and for producing a loss of reference output signal in response to a predetermined condition of the reference frequency signal; and
the clock signal generator means being responsive to the loss of reference output of the loss of reference signal detect means for generating a clock signal of a second frequency different from the first predetermined frequency.

6. An integrated circuit according to claim 5 wherein the loss of reference signal detect means further comprises:
first means for detecting the occurrence of a period of predetermined length during which the reference frequency signal remains in a first predetermined state; and
second means for detecting the occurrence of a period of predetermined length during which the reference frequency signal remains in a second predetermined state; and
third means for producing the loss of reference output signal in response to either of said first and second means.

7. An integrated circuit according to claim 5 wherein the clock signal generator further comprises:
an oscillator circuit coupled to a crystal oscillator external to the integrated circuit, an output of the oscillator comprising the reference frequency signal;
a phase locked loop frequency synthesizer comprising an input coupled to the output of the oscillator circuit, an output of the phase locked loop frequency synthesizer comprising a clock signal having a frequency related to the frequency of the reference frequency signal, the phase locked loop frequency synthesizer further comprising an input coupled to an output of the loss of reference signal detect means and being capable of generating a clock signal having a frequency unrelated to the frequency of the reference frequency signal in response to the signal received therefrom.

8. An integrated circuit according to claim 7 further comprising:
reset means for receiving the loss of reference output signal from the loss of reference signal detect means and for selectably producing a reset signal in response thereto; and
control means for controlling whether the reset means generates the reset signal in response to the loss of reference output signal.

9. An integrated circuit according to claim 7 wherein:
the phase locked loop frequency synthesizer further comprises a programmable divider; and
the loss of reference frequency detect means is responsive to the programming of the programmable divider to produce an output signal.

10. A microprocessor comprising clock signal generator means for receiving a reference frequency signal and for generating a clock signal of a first predetermined frequency in response to the reference frequency signal, the clock signal generator means further comprising:
loss of reference signal detect means for receiving the reference frequency signal and for producing a loss of reference output signal in response to a predetermined condition of the reference frequency signal; and
the clock signal generator means being responsive to the loss of reference output of the loss of reference signal detect means for generating a clock signal of a second frequency different from the first predetermined frequency.

11. A microprocessor according to claim 10 wherein the loss of reference signal detect means further comprises:
first means for detecting the occurrence of a period of predetermined length during which the reference frequency signal remains in a first predetermined state; and
second means for detecting the occurrence of a period of predetermined length during which the reference frequency signal remains in a second predetermined state; and
third means for producing the loss of reference output signal in response to either of said first and second means.

12. A microprocessor according to claim 10 wherein the clock signal generator further comprises:
an oscillator circuit coupled to a crystal oscillator external to the integrated circuit, an output of the oscillator comprising the reference frequency signal;
a phase locked loop frequency synthesizer comprising an input coupled to the output of the oscillator circuit, an output of the phase locked loop frequency synthesizer comprising a clock signal having a frequency related to the frequency of the reference frequency signal, the phase locked loop frequency synthesizer further comprising an input coupled to an output of the loss of reference signal detect means and being capable of generating a clock signal having a frequency unrelated to the frequency of the reference frequency signal in response to the signal received therefrom.

13. A microprocessor according to claim 12 further comprising:
reset means for receiving the loss of reference output signal from the loss of reference signal detect means and for selectably producing a reset signal in response thereto; and
control means for controlling whether the reset means generates the reset signal in response to the loss of reference output signal.

14. A microprocessor according to claim 12 wherein:
the phase locked loop frequency synthesizer further comprises a programmable divider; and
the loss of reference frequency detect means is responsive to the programming of the programmable divider to produce an output signal.

15. A phase-locked loop frequency generator circuit comprising:
oscillator circuit means for producing a reference signal of a first frequency at an output thereof;
a voltage-controlled oscillator having a control voltage input and an oscillator output;
a frequency divider circuit having an input coupled to the oscillator output of the voltage-controlled oscillator and an output;
a phase comparator circuit having inputs coupled to output of the oscillator circuit means and the output of the frequency divider circuit and a phase error output;
a loop filter circuit having an input coupled to the phase error output of the phase comparator circuit and a control voltage output coupled to the control voltage input of the voltage controlled oscillator;
wherein the improvement comprises:
a loss of reference signal detect circuit having an input coupled to the output of the oscillator circuit and a reference enable output;
voltage reference means for producing a voltage reference signal; and
switch means for responding to the reference enable output of the loss of reference signal detect circuit by substituting the voltage reference signal for the control voltage output of the loop filter circuit as the control voltage input of the voltage controlled oscillator.

16. A frequency generator circuit according to claim 15 wherein the loss of reference signal detect circuit further comprises:
first logic means for producing an output signal if the output of the oscillator circuit remains in a first state for a first time period;
second logic means for producing an output signal if the output of the oscillator circuit remains in a second state for a second time period; and
third logic means for producing a loss of reference signal if either of the first or second logic means produces its output signal.

17. A frequency generator circuit according to claim 16 wherein the first and second time periods are determined with reference to the output of the frequency divider circuit.

18. A frequency generator circuit according to claim 17 further comprising:
fourth logic means for detecting a change of the frequency divider circuit and for preventing the production of the loss of reference signal in response thereto.

19. An apparatus for receiving an oscillator signal and for detecting a loss of the oscillator signal comprising:
a first input coupled to a source of the oscillator signal;
a second input coupled to a source of a clock signal;
a first shift register comprising an input coupled to the first input and a first plurality of stages, each of said first plurality of stages having a clock input coupled to the second input and an output;
first logic means having an input coupled to the first input for inverting the oscillator signal;
a second shift register comprising an input coupled to the first logic means and a second plurality of stages, each of said second plurality of stages having a clock input coupled to the clock signal and an output;
second logic means having inputs coupled to said outputs of each of said stages of said first shift register for producing a first loss signal when all of said outputs are in a predetermined logic state;
third logic means having inputs coupled to said outputs of each of said stages of said second shift register for producing a second loss signal when all of said outputs are in a predetermined logic state; and
fourth logic means having inputs coupled to receive said first and second loss signals for producing a loss of oscillator signal when either of said first and second loss signals is received.

20. An apparatus according to claim 19 further comprising:
first reset means having an input coupled to said first input for resetting said second shift register; and
second reset means having an input coupled to said first logic means for resetting said first shift register.

21. An apparatus according to claim 19 further comprising:
fifth logic means coupled to receive control signal inputs for permitting the apparatus to vary its response time for producing the loss of oscillator signal.

22. An apparatus according to claim 19 further comprising:
sixth logic means coupled to receive a control signal input for preventing the apparatus from producing the loss of oscillator signal.

23. An apparatus according to claim 22 wherein said first logic means and said sixth logic means further comprise:
a NOR gate.

24. In an integrated circuit comprising a clock signal generator circuit which receives an oscillator signal and produces a clock signal, a loss of oscillator circuit comprising:
first logic means coupled to receive the oscillator signal for producing an inverted oscillator signal;
a first shift register comprising an input coupled to receive the oscillator signal and a first plurality of stages, each of said first plurality of stages comprising a clock input coupled to receive the clock signal, a reset input coupled to receive the inverted oscillator signal and an output;
a second shift register comprising an input coupled to receive the inverted oscillator signal and a second plurality of stages, each of said second plurality of stages comprising a clock input coupled to receive the clock signal, a reset input coupled to receive the oscillator signal and an output;

second logic means comprising a first plurality of inputs coupled to said outputs of said first plurality of stages for producing a first loss signal;

third logic means comprising a second plurality of inputs coupled to said outputs of said second plurality of stages for producing a second loss signal; and fourth logic means comprising inputs coupled to said second and third logic means for producing a loss of oscillator signal.

25. An apparatus according to claim 24 further comprising:

fifth logic means coupled to receive control signal inputs for permitting the apparatus to vary its response time for producing the loss of oscillator signal.

26. A circuit according to claim 24 further comprising:

sixth logic means coupled to receive a control signal for preventing the circuit from producing the loss of crystal signal.

27. A circuit according to claim 26 wherein said first logic means and said sixth logic means further comprise: a NOR gate.

28. An apparatus for receiving an oscillator signal and for detecting a loss of the oscillator signal comprising:

a first input coupled to a source of the oscillator signal;

a second input coupled to a source of a clock signal;

a first shift register comprising an input coupled to the first input and a first plurality of stages, each of said first plurality of stages having a clock input coupled to the second input and an output;

first logic means having an input coupled to the first input for inverting the oscillator signal;

a second shift register comprising an input coupled to the first logic means and a second plurality of stages, each of said second plurality of stages having a clock input coupled to the clock signal and an output;

second logic means having inputs coupled to said outputs of each of said stages of said first shift register for producing a first loss signal when all of said outputs are in a predetermined logic state;

third logic means having inputs coupled to said outputs of each of said stages of said second shift register for producing a second loss signal when all of said outputs are in a predetermined logic state;

fourth logic means having inputs coupled to receive said first and second loss signals for producing a loss of oscillator signal when either of said first and second loss signals is received; and a third input coupled to the output of one of said first plurality of stages and one of said second plurality of stages for reducing the number of clock signal periods required to produce said loss of oscillator signal.

* * * * *